United States Patent [19]
Nealis

[11] Patent Number: 6,061,249
[45] Date of Patent: May 9, 2000

[54] SEALING SYSTEM AND METHOD FOR SEALING CIRCUIT CARD CONNECTION SITES

[75] Inventor: Edwin J. Nealis, Cary, N.C.

[73] Assignee: Ericsson Inc., Research Triangle Park, N.C.

[21] Appl. No.: 08/968,407

[22] Filed: Nov. 12, 1997

[51] Int. Cl.$^7$ ................................................ H05K 07/10
[52] U.S. Cl. .................... 361/785; 361/788; 361/801; 361/683; 361/803; 439/278; 439/592; 439/281; 174/35 GC; 174/35 R; 174/35 MS; 174/260
[58] Field of Search ..................... 439/278, 592, 439/281; 361/785, 788, 733, 801, 744, 683, 803; 174/35 GC, 35 R, 35 MS, 260

[56] References Cited

U.S. PATENT DOCUMENTS

| | | | |
|---|---|---|---|
| 3,594,696 | 7/1971 | Witek et al. | 439/278 |
| 4,721,478 | 1/1988 | Sonobe | 439/278 |
| 5,266,053 | 11/1993 | Jamet et al. | 439/607 |
| 5,385,487 | 1/1995 | Beitman | 439/540 |
| 5,483,423 | 1/1996 | Lewis et al. | 361/816 |
| 5,867,371 | 2/1999 | Denzene et al. | 361/816 |

FOREIGN PATENT DOCUMENTS

| | | |
|---|---|---|
| 0364416 | 4/1990 | European Pat. Off. . |
| 0865107 | 9/1998 | European Pat. Off. . |
| 9004686 | 7/1990 | Germany . |

OTHER PUBLICATIONS

IBM Bulletin, vol. 39, No. 11, Nov. 1996.

*Primary Examiner*—Leo P. Picard
*Assistant Examiner*—David Foster
*Attorney, Agent, or Firm*—Wood, Phillips, VanSanten, Clark & Mortimer

[57] ABSTRACT

In one form, the invention is directed to the combination of: a plate; a first connector on the plate; a first circuit card assembly including a first circuit card and a second connector on the first circuit card which second connector is capable of coupling to the first connector; and a layer of sealing material on the plate and having a first opening therein to accept a part of the first circuit card assembly with the first and second connectors coupled. The layer of sealing material has a first cantilevered flap which has a first, relaxed state. The first cantilevered flap is deflected from the first state into a second state wherein the first cantilevered flap bears sealingly against a part of the first circuit card assembly with the first and second connectors coupled.

35 Claims, 6 Drawing Sheets

SEALING SYSTEM AND METHOD FOR SEALING CIRCUIT CARD CONNECTION SITES

FIELD OF THE INVENTION

The present invention is directed to a sealing system and method and, in particular, to a sealing system and method for sealing circuit card connection sites.

BACKGROUND OF THE INVENTION

Base stations are used in the transfer of telephone calls along a cellular telephone system or network. Each base station has a backplane or plate. The backplane is a printed circuit board with two or more connectors mounted on the board. Circuit card assemblies, each of which has a circuit card and a circuit card connector on the circuit card, are attached to the backplane with the circuit card connectors each coupled to one of the backplane connectors so that the circuit cards can interface with each other through the backplane. The backplane and circuit cards are contained in a sheet metal enclosure known in the industry as a rack.

The circuitry of the base station is commonly cooled to operate reliably. One way in which the circuitry may be cooled is to circulate the air in the rack through an air conditioner or heat exchanger. The use of an air conditioner or heat exchanger is not universally desirable. The air conditioner or heat exchanger may make the overall base station construction complex, leading potentially to frequent and/or costly maintenance. The air conditioner or heat exchanger may also add significantly to the cost of manufacturing the base station. Moreover, the air conditioner or heat exchanger may raise the power consumption of the base station to an undesirable level.

Alternatively, the circuitry may be cooled using air drawn through the base station from the surrounding environment. This arrangement can also create problems. If the air is polluted, soot and other contaminants in the air can degrade the performance of the circuitry. For optimum performance, it is important to prevent pollution from reaching the connection sites between the backplane and the circuit card.

SUMMARY OF THE INVENTION

In one form, the invention is directed to the combination of: a plate; a first connector on the plate; a first circuit card assembly including a first circuit card and a second connector on the first circuit card which second connector is capable of coupling to the first connector; and a layer of sealing material on the plate and having a first opening therein to accept a part of the first circuit card assembly with the first and second connectors coupled. The layer of sealing material has a first cantilevered flap which has a first, relaxed state. The first cantilevered flap is deflected from the first state into a second state, wherein the first cantilevered flap bears sealingly against a part of the first circuit card assembly with the first and second connectors coupled.

A rack, with guides, can be used to support the circuit card assembly. Multiple circuit card assemblies can be supported by the rack in similar fashion.

The plate may include a circuit board.

In one form, the circuit board and circuit card have planar surfaces which are angularly disposed with the connectors coupled.

A layer of spacing material may be provided between the plate and the layer of sealing material.

The sealing material and/or spacing material may be made from foam.

The spacing material may have an opening to accept a part of the first circuit card assembly and may be dimensioned so that there is a clearance space between the part of the first circuit card assembly and the layer of spacing material at the opening to allow the first cantilevered flap in the second state to be deflected into the clearance space.

The cantilevered flap may be defined by slits through the layer of sealing material.

The cantilevered flap may define an edge which bounds the first opening in the layer of sealing material.

In one form, the first opening in the layer of sealing material is substantially rectangular, with there being four flaps having edges bounding the rectangular opening. The clearance space may be configured to allow each of the four flaps to be deflected into the clearance space so that each bears sealingly against a part of the first circuit card assembly.

The invention also contemplates the combination of: a plate; a first connector on the plate; a circuit card assembly including a circuit card and a second connector on the circuit card which second connector is capable of coupling to the first connector; a layer of spacing material on the plate; and a layer of sealing material on the layer of spacing material and having an opening therein to accept a part of the circuit card assembly with the first and second connectors coupled. The layer of sealing material has a cantilevered flap which has a first, relaxed state. The cantilevered flap is deflected from the first state into a second state, wherein the cantilevered flap bears sealingly against a part of the circuit card assembly with the first and second connectors coupled.

The invention also contemplates a method of sealing a connection site for a first connector on a plate and a second connector on a circuit card assembly which includes a circuit card and a second connector. The method includes the steps of: providing a layer of sealing material on the plate which sealing material has an opening bounded by a cantilevered flap having a first relaxed state; aligning the first and second connectors in a predetermined orientation; relatively moving the plate and circuit card assembly to couple the first and second connectors; and deflecting the cantilevered flap from the first state into a second state wherein the cantilevered flap bears sealingly against part of the circuit card assembly with the first and second connectors coupled.

The step of deflecting the cantilevered flap may involve the step of directing the circuit card assembly against the cantilevered flap to deflect the cantilevered flap from the first state into the second state as an incident of the plate and circuit card assembly being relatively moved to couple the first and second connectors.

DETAILED DESCRIPTION OF THE PREFERRED EMBODIMENT

Figure 1:
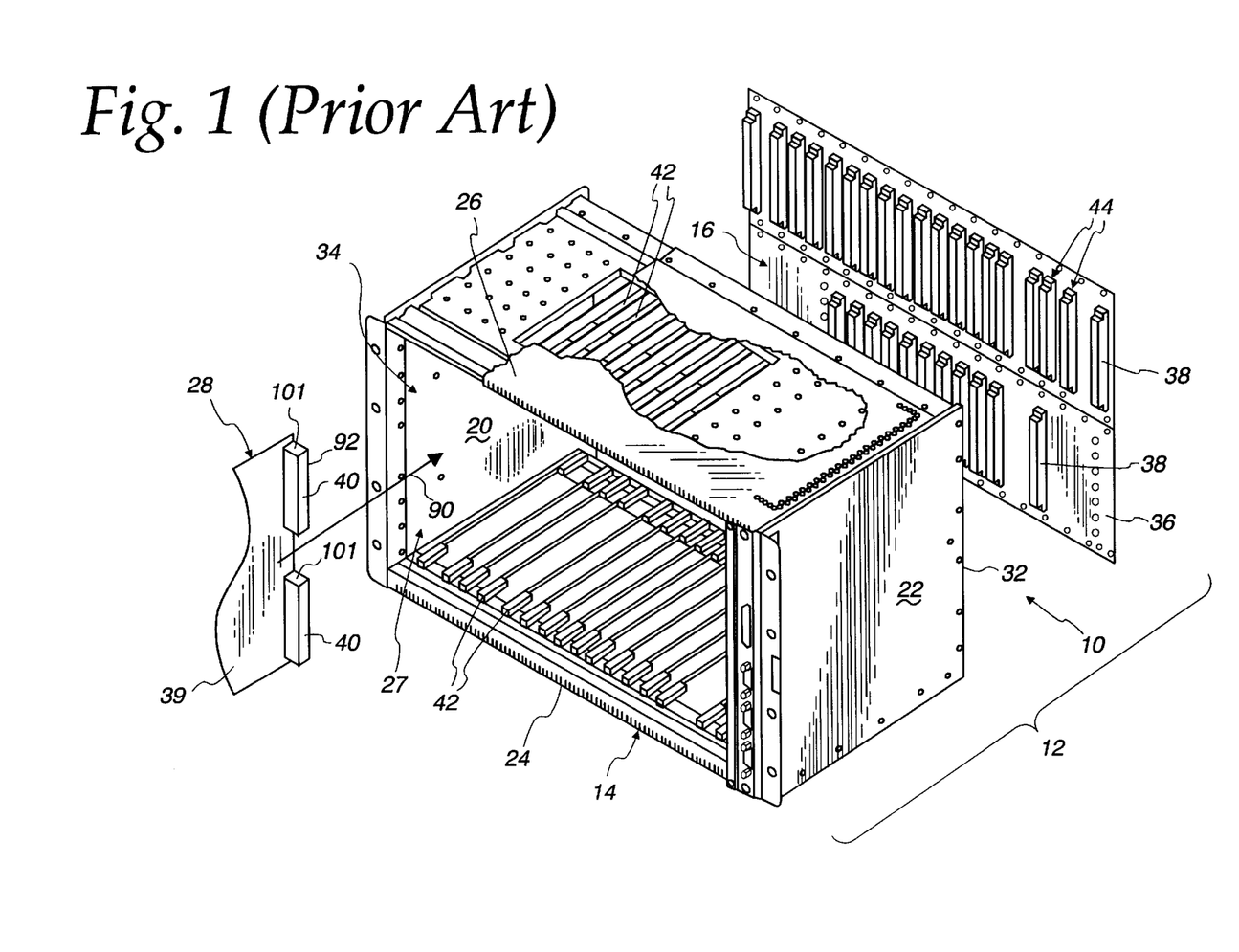
FIG. 1 is an exploded, perspective view of a prior art base station, as used in a cellular telephone system or network, and having a rack to which a backplane/plate is mounted, with the backplane/plate having connectors which couple at connection sites to connectors on circuit card assemblies which interface with each other through the backplane/plate.

In FIG. 1, a base station is shown at 10 as one exemplary environment for the present invention. The base station 10 is of a type conventionally used to transfer telephone calls along a cellular telephone system or network.

The base station 10 has a container or rack 12 consisting of a housing 14 and a backplane/plate 16. The housing 14 has side walls 20, 22, a bottom wall 24 and a bottom top 26 which cooperatively bound a storage space 27 for circuit card assemblies 28 (part of one shown in FIG. 1). The housing 14 has an open back wall 32 which is covered by the backplane/plate 16 and a front wall opening 34 to allow the circuit card assemblies 28 to be directed into the storage space 27 to be operatively connected to the backplane/plate 16.

The backplane/plate 16 consists of a circuit board 36 with connectors 38 thereon. Each circuit card assembly 28 consists of a circuit card 39 with connectors 40 thereon. The connectors 40 on the circuit cards 39 are designed to both electrically and mechanically couple to the circuit board connectors 38. The circuit cards 39 interface with each other through the circuitry on the backplane/plate 16.

Horizontally spaced, elongate guides 42 are provided on the walls 24, 26 to guide the circuit card assemblies 28 from front to rear on the rack 12 to facilitate coupling of the connectors 38, 40. The guides 42 also support the circuit card assemblies 28 in an operative position, wherein the connectors 38, 40 are coupled.

As previously mentioned, for reliable operation of the circuitry on the base station 10, it is important to avoid migration of foreign matter to between the connectors 38, 40 at each connection site 44. To address this problem, a sealing system, as shown at 46 in each of FIGS. 2–8, is incorporated into the base station 10. It should be understood that the inventive sealing system 46 is intended to have a more universal application. The base station 10 is but one exemplary environment in which the inventive sealing system 46 has particular utility.

Figure 2:
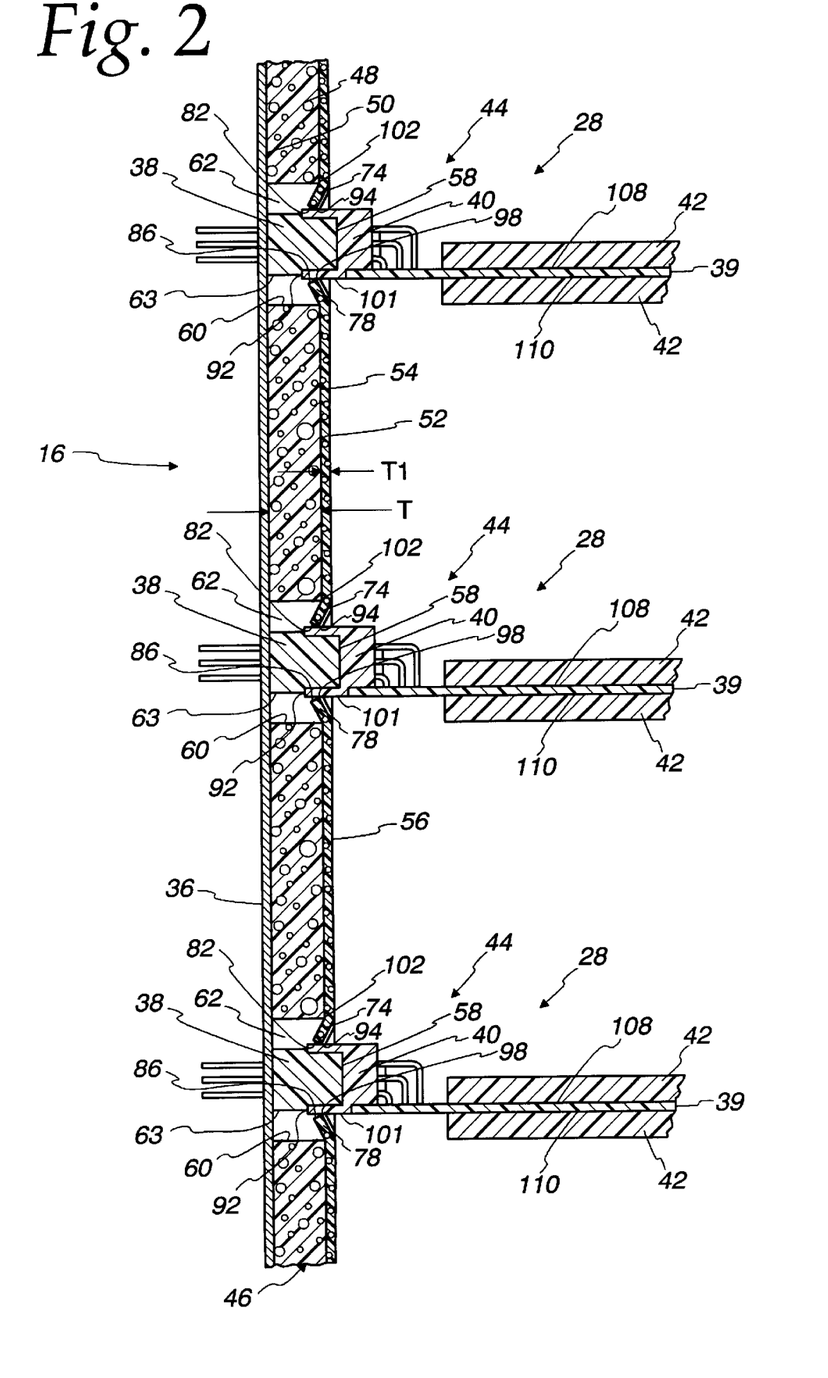
FIG. 2 is a fragmentary, cross-sectional view of three connection sites on the base station of FIG. 1 with a sealing system, according to the invention, incorporated therein.
Figure 3:
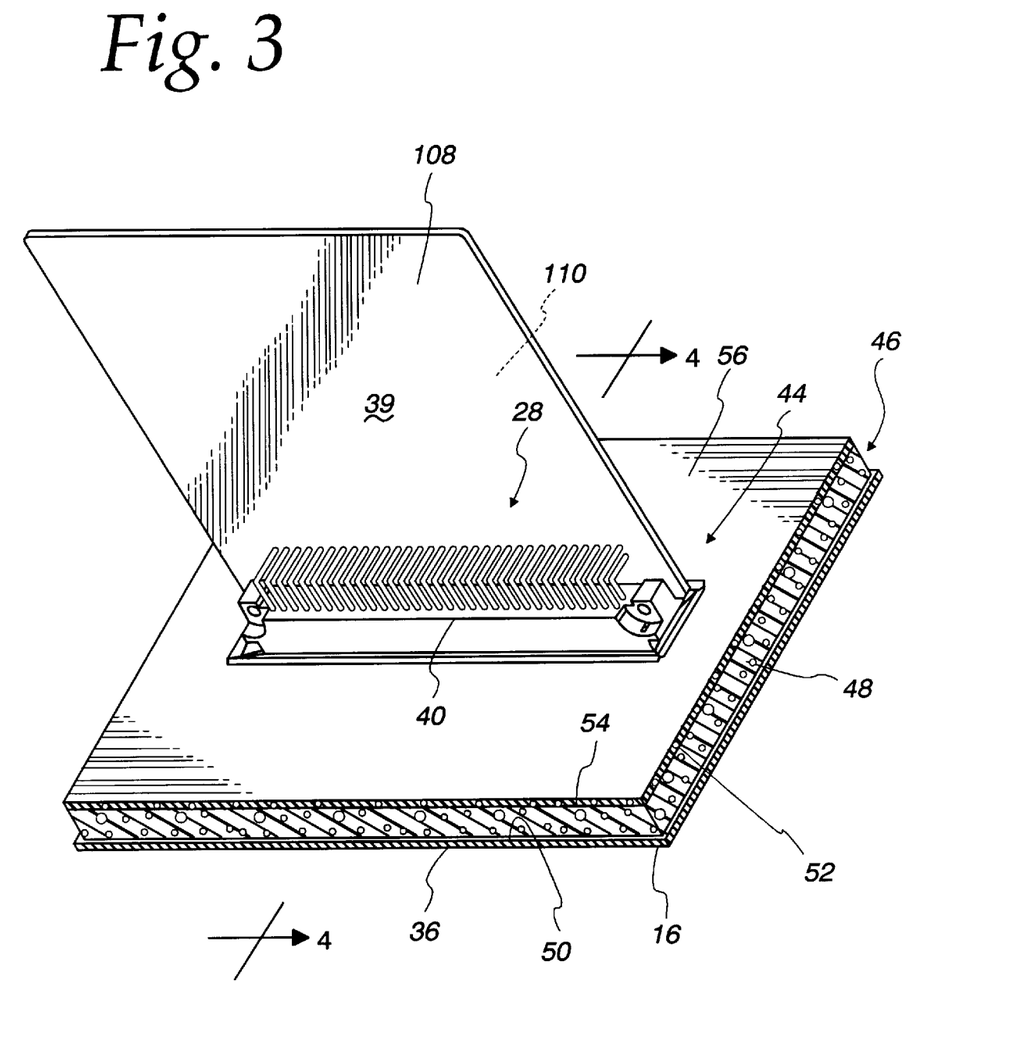
FIG. 3 is a fragmentary, perspective view of one of the connection sites in FIG. 2.
Figure 4:
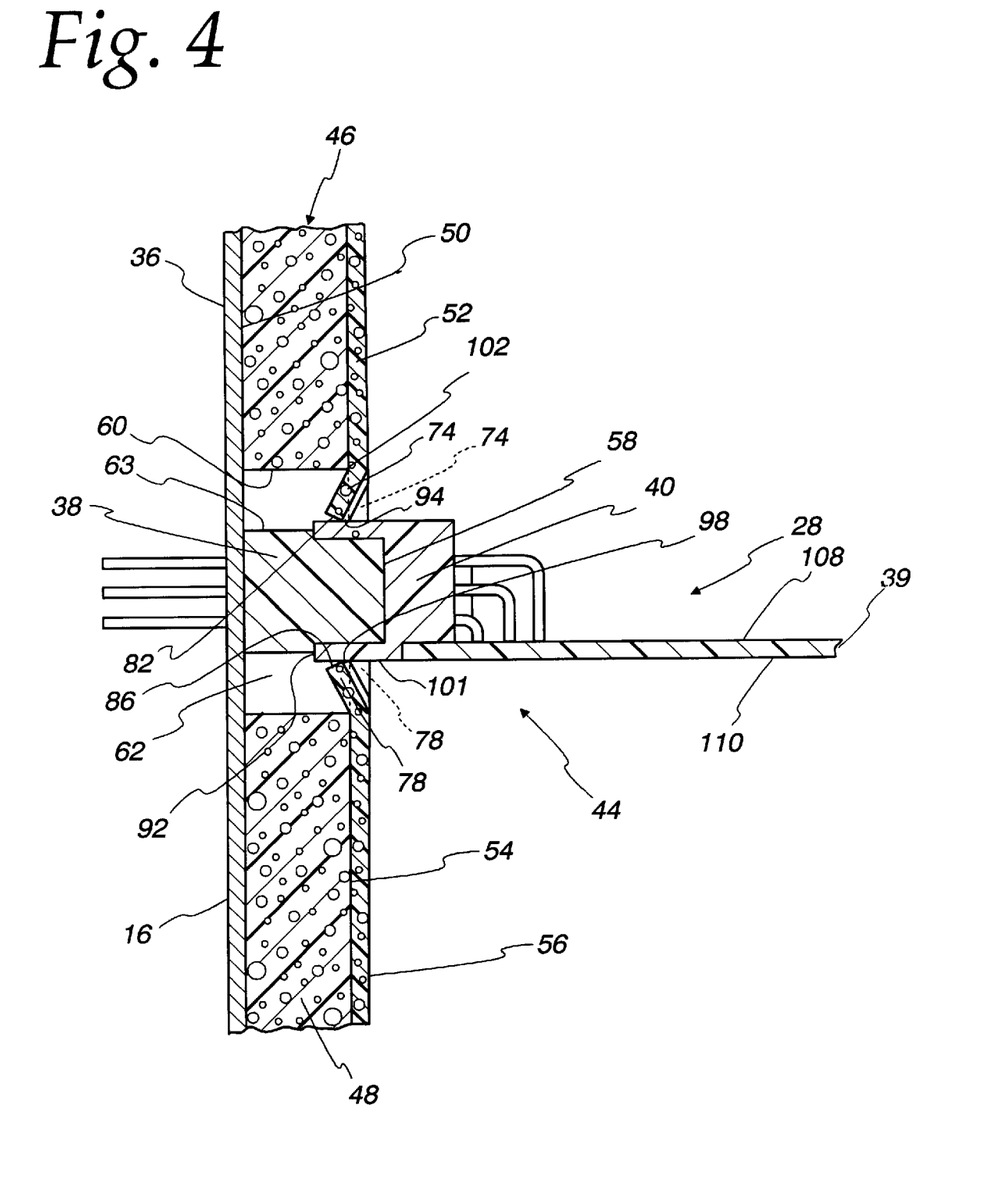
FIG. 4 is an enlarged, cross-sectional view of the connection site taken along line 4—4 of FIG. 3.
Figure 5:
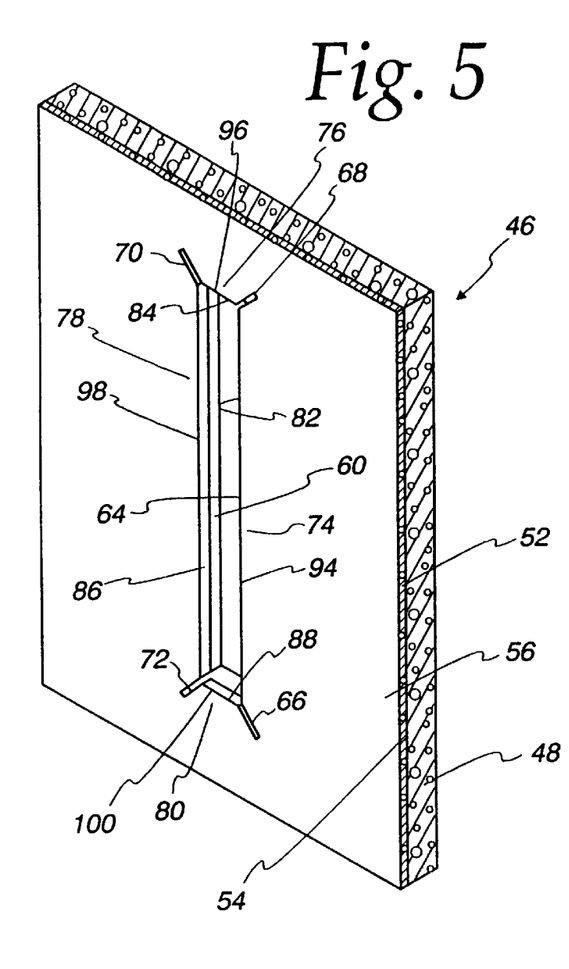
FIG. 5 is a fragmentary, perspective view of the inventive sealing system at a connection site.
Figure 6:
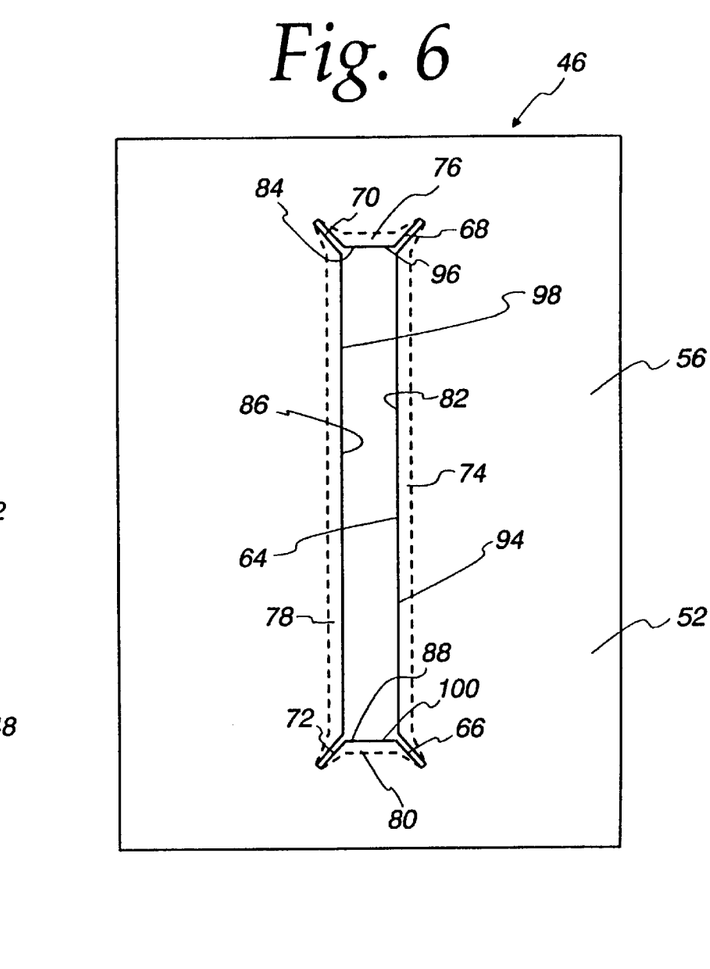
FIG. 6 is a fragmentary, front elevation view of the inventive sealing system at a connection site.
Figure 7:
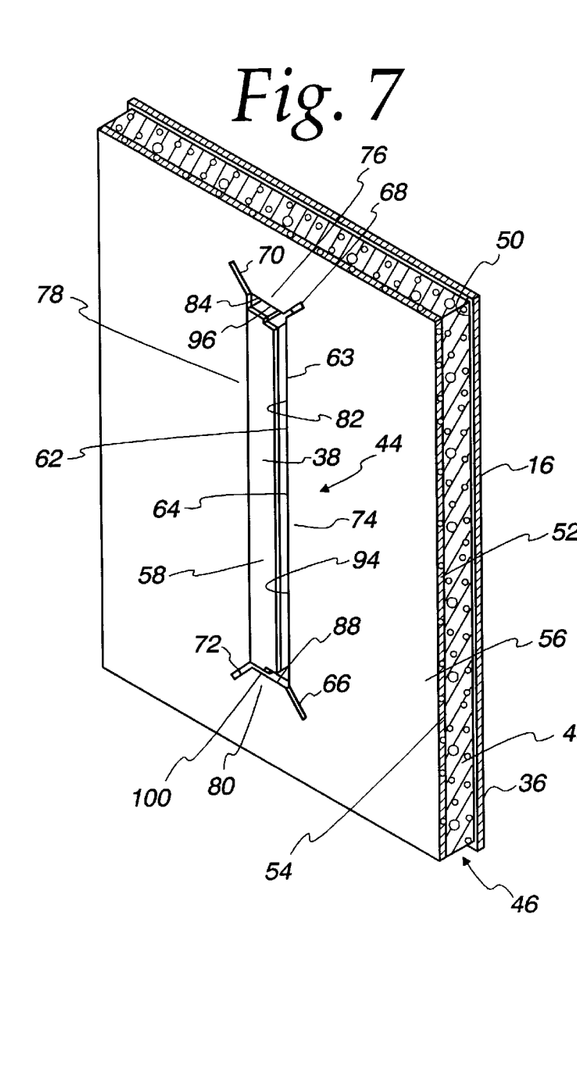
FIG. 7 is a view as in FIG. 5 with the inventive sealing system attached to the backplane/plate.
Figure 8:
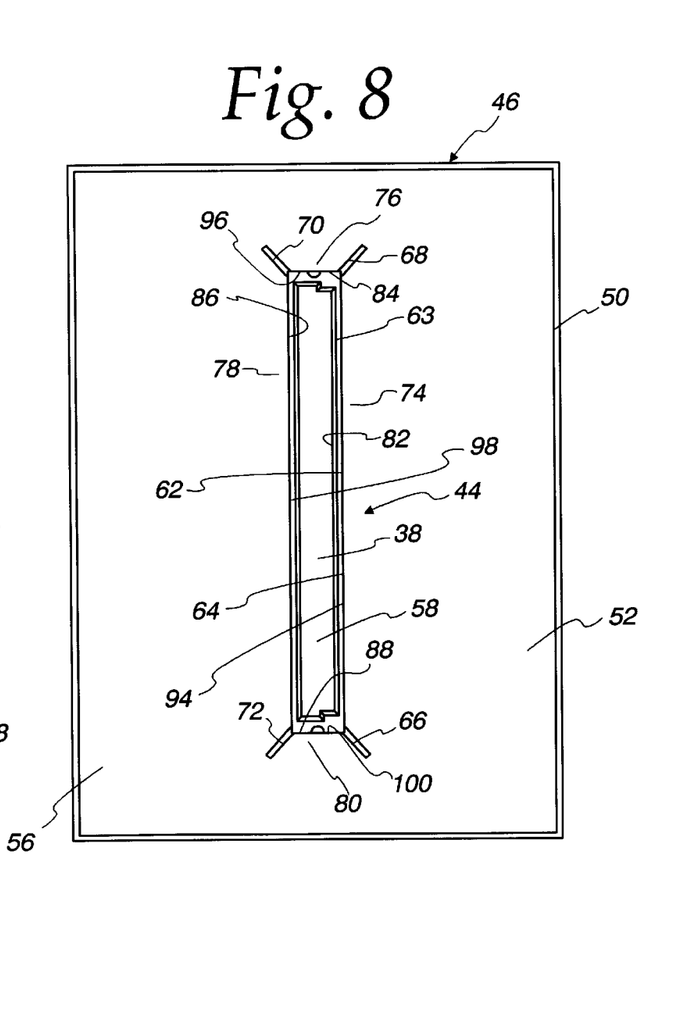
FIG. 8 is a view as in FIG. 6 with the sealing system attached to the backplane/plate.

The sealing system 46 consists of a spacing layer 48 which is adhered to the backplane/plate 16, as by an adhesive. The spacing layer 48 may be formed as one continuous sheet over the exposed flat surface 50 of the backplane/plate 16, or may be made up of a number of discrete elements strategically located around the connectors 38. The spacing layer 48 is preferably made of foam, although it could be made from another material. The spacing function could also be performed by other than a sheet layer.

A sealing layer 52 is in turn applied over the exposed surface 54 of the spacing layer 48. The sealing layer 52 may likewise be made from foam. The sealing layer 52 can be secured by an adhesive to the spacing layer 48, or in another manner known to those skilled in the art. The thicknesses T, T1 (FIG. 2) for the spacing layer 48 and sealing layer 52, respectively, are chosen so that the exposed surface 56 of the sealing layer 52 is spaced forwardly from the backplane/plate surface 50 slightly less than the forwardmost portion 58 of each backplane/plate connector 38.

The spacing layer 48 has openings 60 formed therethrough to define a clearance space 62 around each backplane/plate connector 38. In this case, the backplane/plate connectors 38 are shown to have a generally rectangular peripheral wall 63, with the clearance space 62 having a corresponding, but larger, rectangular shape. The clearance space 62 preferably accommodates the connectors 40 on the circuit card assemblies 28 without interference.

The sealing layer 52 has openings 64 aligned with the spacing layer openings 60. Each opening 64 is likewise generally rectangular to accept the circuit card assembly 28 with the connectors 38, 40 coupled. Four slits 66, 68, 70, 72 are formed through the sealing layer 52 to define four deflectable flaps 74, 76, 78, 80 in the sealing layer 52. The flaps 74, 76, 78, 80 are shown in a relaxed state in FIGS. 5–8 and in dotted lines in FIG. 4, and are each deflectable into a second state, wherein the flaps 74, 76, 78, 80 move into the clearance space 62. The flaps 74, 76, 78, 80 have edges 82, 84, 86, 88 which cooperatively bound the opening 64 with the flaps 74, 76, 78, 80 in the relaxed state.

To effect connection between the circuit card assemblies 28 and the backplane/plate 16, the circuit card assemblies 28 are aligned individually in a first predetermined orientation between the guides 42 and advanced through the front housing opening 34 in the direction of the arrow 90 in FIG. 1. Initially, the leading edges 92 of the connectors 40 encounter the flaps 74, 76, 78, 80. Continued movement of the circuit card assemblies 28 causes the flaps 74, 76, 78, 80 to deflect into the clearance space 62 towards the backplane/plate 16. As this occurs, the corners 94, 96, 98, 100 of the flaps 74, 76, 78, 80 sweep along the peripheral surfaces 101 of the connectors 40 until the connectors 38, 40 couple. At this point, the flaps 74, 76, 78, 80 produce a sealing action around the peripheral surface 101 of each connector 40. As this bending of the flaps 74, 76, 78, 80 occurs, the corner 102 of the spacing layer 48 around the opening 60 acts as a fulcrum and flexes only slightly to produce a residual force urging the flap corners 94, 96, 98, 100 sealingly against the peripheral surface 101 of the connectors 40.

It should be understood that fewer or more flaps 74, 76, 78, 80 could be provided. For example, a sealing action could be produced by a single flap 74, 76, 78, 80.

It should also be understood that the specific relationship between each circuit card assembly 28 and backplane/plate 16 disclosed is not required. In this particular embodiment, the plane of the backplane/plate surface 50 is substantially perpendicular to the planes of oppositely facing and parallel, flat surfaces 108, 110 on the circuit card 39.

The specific number of connection sites 44 is also not critical to the present invention. By reason of providing the clearance space 62, the deflectable tabs 74, 76, 78, 80 cause only a slight deformation of the corner 102 on the spacing layer 48 so that no appreciable compressive force is transmitted to the backplane/plate 16. Since the sealing function is accomplished primarily by the sealing layer 52 and not the spacing layer 48, no potentially detrimental compression of the spacing layer 48 is required, as might bow the backplane/plate 16 or counteract the connection interface between the connectors 38, 40.

Further, in the event that the circuit card assemblies 28 are initially misaligned with the backplane/plate connectors 38, the clearance space 62 allows the circuit card assemblies 28 to shift in the plane of the backplane/plate surface 50 without significantly deforming or damaging the spacing layer 48. The flaps 74, 76, 78, 80 will deflect differently to accept the misaligned circuit card assemblies 28 until coupling of the connectors 38, 40 is effected.

While the flaps 74, 76, 78, 80 are shown to be deflected inwardly toward the backplane/plate surface 50, assembly could be carried out by advancing the circuit card assemblies 28 partially through the openings 60 and thereafter partially withdrawing the circuit card assemblies 28 to cause the flaps 74, 76, 78, 80 to deflect from the relaxed state away from the backplane/plate surface 50. By then fully advancing the circuit card assemblies 28 to couple the connectors 38, 40, the same sealing action between the flaps 74, 76, 78, 80 and connectors 40 is established with the flaps 74, 76, 78, 80 deflected outwardly.

The foregoing disclosure of specific embodiments is intended to be illustrative of the broad concepts comprehended by the invention.

I claim:

1. In combination:
    a plate;
    a first connector on the plate;
    a first circuit card assembly comprising a first circuit card and a second connector on the first circuit card which second connector is capable of coupling to the first connector; and
    a layer of sealing material on the plate and having a first opening therein to accept a part of the first circuit card assembly with the first and second connectors coupled,
    the layer of sealing material having a first cantilevered flap which has a first, relaxed state,
    said first cantilevered flap deflected from the first state into a second state wherein the first cantilevered flap bears sealingly against a part of the first circuit card assembly with the first and second connectors coupled.

2. The combination according to claim 1, wherein the plate comprises a circuit board.

3. The combination according to claim 2, wherein the first circuit card has a planar surface, the circuit board has a planar surface, and with the first and second connectors coupled, the planar surface on the first circuit card is disposed substantially perpendicularly to the planar surface on the circuit board.

4. The combination according to claim 2, in combination with a rack, wherein the circuit board is mounted on the rack and the rack has a guide which supports the first circuit card with the first and second connectors coupled.

5. The combination according to claim 1, further comprising a third connector on the plate and a second circuit card assembly comprising a second circuit card and a fourth connector on the second circuit card which fourth connector is capable of coupling to the third connector, wherein the layer of sealing material has a second opening to accept a part of the second circuit card assembly with the third and fourth connectors coupled, the layer of sealing material having a second cantilevered flap having a first relaxed state, said second cantilevered flap being deflectable from the first state for the second cantilevered flap into a second state wherein the second cantilevered flap bears sealingly against a part of the second circuit card assembly with the third and fourth connectors coupled.

6. The combination according to claim 1, further comprising a layer of spacing material disposed between the plate and the layer of sealing material.

7. The combination according to claim 6, wherein the layer of spacing material comprises foam material secured to the plate.

8. The combination according to claim 7, wherein the layer of sealing material comprises foam material secured to the layer of spacing material.

9. The combination according to claim 6, wherein the layer of spacing material has an opening therein to accept a part of the first circuit card assembly with the first and second connectors coupled.

10. The combination according to claim 9, wherein with the first and second connectors coupled, there is a clearance space between the part of the first circuit card assembly and the layer of spacing material and the first cantilevered flap in the second state is deflected into the clearance space.

11. The combination according to claim 10, wherein the second connector has a peripheral surface and the clearance space extends continuously around the peripheral surface of the second connector.

12. The combination according to claim 1, wherein the first cantilevered flap is defined by a pair of slits through the layer of sealing material.

13. The combination according to claim 1, wherein the first cantilevered flap defines an edge which bounds the first opening in the layer of sealing material.

14. The combination according to claim 13, wherein the first opening in the layer of sealing material is substantially rectangular and bounded by four edges and the sealing material has four flaps, each flap defining one of the four edges bounding the first opening in the layer of sealing material.

15. The combination according to claim 14, wherein each of the four flaps is defined by a pair of slits in the layer of sealing material.

16. The combination according to claim 15, wherein with the first and second connectors coupled, there is a clearance space between the first circuit card assembly and the layer of spacing material, and each of the four flaps is deflectable into the clearance space to bear sealingly against a part of the first circuit card assembly.

17. In combination:
    a plate;
    a first connector on the plate;
    a circuit card assembly comprising a circuit card and a second connector on the circuit card which second connector is capable of coupling to the first connector;
    a layer of spacing material on the plate; and
    a layer of sealing material on the layer of spacing material and having an opening therein to accept a part of the circuit card assembly with the first and second connectors coupled,
    the layer of sealing material having a cantilevered flap which has a first, relaxed state,
    said cantilevered flap deflected from the first state into a second state wherein the cantilevered flap bears sealingly against a part of the circuit card assembly with the first and second connectors coupled.

18. The combination according to claim 17, wherein the plate comprises a circuit board.

19. The combination according to claim 18, wherein the circuit card has a planar surface, the circuit board has a planar surface, and with the first and second connectors coupled, the planar circuit card surface is disposed substantially perpendicularly to the planar circuit board surface.

20. The combination according to claim 18, in combination with a rack, wherein the circuit board is mounted on the rack and the rack has a guide which supports the circuit card with the first and second connectors coupled.

21. The combination according to claim 17, further comprising a third connector on the plate and a second circuit card assembly comprising a second circuit card and a fourth connector on the second circuit card which fourth connector is capable of coupling to the third connector, wherein the layer of sealing material has a second opening to accept a part of the second circuit card assembly with the third and fourth connectors coupled, the layer of sealing material having a second cantilevered flap having a first relaxed state, said second cantilevered flap being deflectable from the first state for the second cantilevered flap into a second state wherein the second cantilevered flap bears sealingly against a part of the second circuit card assembly with the third and fourth connectors coupled.

22. The combination according to claim 17, wherein the layer of spacing material comprises foam material, and the layer of sealing material comprises foam material.

23. The combination according to claim 17, wherein the layer of spacing material has an opening therein to accept a part of the circuit card assembly with the first and second connectors coupled.

24. The combination according to claim 23, wherein with the first and second connectors coupled, there is a clearance space between the part of the circuit card assembly and the layer of spacing material and the flap in the second state is deflected into the clearance space.

25. The combination according to claim 24, wherein the second connector has a peripheral surface and the clearance space extends continuously around the peripheral surface of the second connector.

26. The combination according to claim 17, wherein the first cantilevered flap is defined by a pair of slits through the layer of sealing material.

27. The combination according to claim 17, wherein the first cantilevered flap defines an edge which bounds the opening in the layer of sealing material.

28. The combination according to claim 17, wherein the opening in the layer of sealing material is substantially rectangular and bounded by four edges and the layer of sealing material has four flaps, each flap defining one of the four edges bounding the opening in the layer of sealing material.

29. The combination according to claim 28, wherein each of the four flaps is defined by a pair of slits in the layer of sealing material.

30. The combination according to claim 29, wherein with the first and second connectors coupled, there is a clearance space between the circuit card assembly and the layer of spacing material, and each of the four flaps is deflectable into the clearance space to bear sealingly against a part of the first circuit card assembly.

31. A method of sealing a connection site for a first connector on a plate and a second connector on a circuit card assembly comprising a circuit card and the second connector, said method comprising the steps of:

providing a layer of sealing material on the plate which sealing material has an opening bounded by a cantilevered flap having a first relaxed state;

aligning the first and second connectors in a predetermined orientation;

relatively moving the plate and circuit card assembly to couple the first and second connectors; and deflecting the cantilevered flap from the first state into a second state wherein the cantilevered flap bears sealingly against a part of the circuit card assembly with the first and second connectors coupled.

32. The method of sealing a connection site according to claim 31 wherein the step of deflecting the cantilevered flap comprises the step of directing the circuit card assembly against the cantilevered flap and causing the circuit card assembly to deflect the cantilevered flap from the first state into the second state as an incident of the plate and circuit card assembly being relatively moved to couple the first and second connectors.

33. The method of sealing a connection site according to claim 31 wherein the step of providing a layer of sealing material comprises the step of providing a layer of sealing material that comprises foam.

34. The method of sealing a connection site according to claim 31 further comprising the step of providing a layer of spacing material between the plate and the layer of sealing material.

35. The method of sealing a connection site according to claim 34 wherein the step of providing a layer of spacing material comprises the step of providing a layer of sealing material that comprises foam.

* * * * *